(12) United States Patent
Mu

(10) Patent No.: US 8,130,053 B2
(45) Date of Patent: Mar. 6, 2012

(54) TANK TUNING FOR BAND PASS FILTER USED IN RADIO COMMUNICATIONS

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 210 days.

(21) Appl. No.: 12/417,446

(22) Filed: Apr. 2, 2009

(65) Prior Publication Data
US 2010/0253442 A1 Oct. 7, 2010

(51) Int. Cl.
*H03G 11/04* (2006.01)
*H03H 11/00* (2006.01)

(52) U.S. Cl. ........................ 333/17.1; 333/174
(58) Field of Classification Search .......... 333/17.1, 333/235, 174; 324/76.11, 76.12, 76.13, 76.15, 324/76.16, 76.17, 76.18, 76.39, 76.51; 334/41, 334/42
See application file for complete search history.

(56) References Cited

U.S. PATENT DOCUMENTS

| | | | |
|---|---|---|---|
| 6,307,442 B1 * | 10/2001 | Meyer et al. ................ | 333/17.1 |
| 6,307,443 B1 | 10/2001 | Gabara | |
| 7,016,388 B2 * | 3/2006 | Klene et al. ................. | 372/55 |
| 7,102,465 B2 | 9/2006 | Utsunomiyo et al. | |
| 7,126,403 B2 | 10/2006 | Kenney, Jr. et al. | |
| 7,161,416 B2 | 1/2007 | Gangi | |
| 7,449,970 B2 * | 11/2008 | Yu et al. .................... | 331/177 V |
| 7,761,067 B1 * | 7/2010 | Tsai et al. .................. | 455/127.2 |
| 7,855,610 B2 * | 12/2010 | Taghivand et al. ........... | 331/167 |
| 2004/0012450 A1 | 1/2004 | Nguyen | |

FOREIGN PATENT DOCUMENTS

| | | |
|---|---|---|
| EP | 1630960 A1 | 3/2006 |
| WO | 00/70757 | 11/2000 |
| WO | 03/038999 A1 | 5/2003 |

OTHER PUBLICATIONS

Wiser, R., et al., "A 5-GHz wireless LAN transmitter with integrated tunable high-Q RF filter." Custom Integrated Circuits Conference, 2008. CICC 2008. IEEE. Sep. 21-24, 2008, San Jose, CA. pp. 607-610. IEEE, Piscataway, NJ.

Liu, H., et al., "An automatic tuning scheme for high frequency bandpass filters." Circuits and Systems, 2002. IEEE International Symposium on. ISCAS 2002. vol. 3, May 26-29, 2002, Scottsdale, AZ. pp. III-551-III-554. IEEE, Piscataway, NJ.

(Continued)

*Primary Examiner* — Dean O Takaoka
(74) *Attorney, Agent, or Firm* — Coats & Bennett, P.L.L.C.

(57) ABSTRACT

A tuning method and circuit for an LC tank resonant circuit, including an inductor and a variable capacitor, are described. In a tuning mode, an RF input signal is applied to an input port of the circuit, and the RF output signal is monitored as a variable capacitor control input is varied. A peak output is detected, and the corresponding variable capacitor control input is stored, and applied to the variable capacitor in an operating mode. In one embodiment, the variable capacitor control input is adjusted for delay in the peak detection process. In one embodiment, the variable capacitor comprises a coarse capacitor and a fine capacitor; the tuning procedure is repeated for each capacitor; and both coarse and fine variable capacitor control inputs are stored and applied to the respective capacitors in operating mode.

21 Claims, 13 Drawing Sheets

OTHER PUBLICATIONS

Chang, Y., et al., "On-chip automatic direct tuning circuitry based on the synchronous rectification scheme for CMOS gigahertz band front-end filters." ISCAS 2001. The 2001 IEEE International Symposium on Circuits and Systems, 2001. vol. 4, May 6-9, 2001, Sydney, Australia. pp. 246-249. IEEE, Piscataway, NJ.

Barnett, K., et al., "A multi-standard mobile digital video receiver in 0.18μm CMOS process." 34th European Solid-State Circuits Conference, 2008. ESSCIRC 2008. Sep. 15-19, 2008, Edinburgh, Scotland. pp. 154-157. Institute of Physics (IOP), London, UK.

Mirzaei, A., et al., "Low-Power WCDMA Transmitter with an Integrated Notch Filter." IEE International Solid-State Circuits Conference. ISSCC 2008. Feb. 3-7, 2008, San Francisco, CA. pp. 212-213. IEEE, Piscataway, NJ.

Pozsgay, A. et al., "A fully digital 65nm CMOS transmitter for the 2.4-to-2.7GHz WiFi/WiMax bands using 5.4GHz $\Delta\Sigma$RF DACs." IEE International Solid-State Circuits Conference. ISSCC 2008. Feb. 3-7, 2008, San Francisco, CA. pp. 360-361. IEEE, Piscataway, NJ.

* cited by examiner $C = Cc + Cf + Cv + Cp$

TANK TUNING FOR BAND PASS FILTER USED IN RADIO COMMUNICATIONS

TECHNICAL FIELD

The present invention relates generally to RF resonant circuits, and in particular to a tunable RF tank circuit usable as a band pass filter in radio communications.

BACKGROUND

Radio frequency (RF) resonant circuits are fundamental building blocks in a wide variety of electronic applications, such as wireless communications. Examples include their use in frequency up/down-converters, IQ modulators, and variable gain amplifiers. In many cases, the resonant circuits must exhibit high signal to noise ratio (SNR), high linearity, and low phase noise.

As one representative example, FIG. 18 depicts the basic functionality of an RF transmitter 10, such as may be found in a mobile communication system handset. The transmitter 10 includes one or more low-pass filters 12 and an IQ modulator 14 receiving transmission frequency signals from an IQ clock generator and driver circuit 16. The modulator up-converts the baseband signals into radio frequency (RF) by a direct up-conversion where the baseband frequency signals are multiplied by a local oscillator (LO) signal. The IQ modulated signal is filtered by a band-pass filter and variable gain amplifier (VGA) 18, which provides variable gain as required by the transmitter signal path. A surface acoustic wave (SAW) filter 20 further filters the RF signal before it is amplified for transmission by a power amplifier 22.

SAW filters 20 are effective in suppressing spurious emission outside the SAW pass band, as well as noise arising from transmitter leaking to other circuits, such as a receiver. However, mobile devices operable in multiple frequency bands, such as those compatible with different communication standards, require separate SAW filters 20 for each operating frequency. This requires an increase in the number of electronic parts in the device, raising cost, increasing power consumption, and defeating miniaturization. Replacing the SAW filter 20 in the transmitter 10 would allow for a more compact and lower cost design. However, there are several challenges to be met in replacing SAW filters 20.

The noise spectrum at a transmitter 10 can extend into the receiver band, and due to limited isolation of an antenna duplexer, the transmitted signal also creates a leakage at the receiver front-end, causing degradation to the receiver noise figure. To remove the SAW filter 20, the IQ modulator 14 and VGA 18 must have enough SNR, and must not generate high levels of noise in the receiver frequency band(s). To improve SNR, the signal level must be large, which implies high power consumption. Theoretically, twice the power consumption can improve SNR 3 dB, but in practice only 2~2.5 dB can be expected.

The spurious emission in other radio frequency bands and channels must be low enough to meet the spectrum mask requirements. This calls for high linearity in the IQ modulator 14 and VGA 18, and a high quality baseband signal. Non-linearity in IQ modulator 14 and VGA 18 will create new frequency interference products, which may influence other radio devices nearby. Digital baseband signals are converted to analog in, or prior to, the IQ modulator 14, and the reconstruction error in this conversion must be very low.

The phase noise in local clocks must be very low; otherwise, the phase noise will be up-converted into radio frequency noise. This requires a phase locked loop (PLL) with very low phase noise, which is very difficult to design. This is particularly true for a single-chip RF transceiver design, where the interference between different functional blocks cannot be ignored.

It is thus apparent that replacing the SAW filters 20 in a mobile communication transmitter 10 is a daunting task. Several approaches are known in the art. Ahmad Mirzaei and Hooman Darabi propose one such approach in the paper, "A Low-Power WCDMA Transmitter with an Integrated Notch Filter," published in the ISSCC-2008, at p. 212-213 (2008). In this approach, a feedback notch filter in the transmitter 10 path is intended to have a notch filter at the frequency of the receiver band, which provides about 19 dB suppression in frequency transfer function. However, the disturbance to the desired transmitter signal due to the insertion of the notch filter is a serious problem. Another issue is that the notch filter itself introduces noise into the mixed RF output. Therefore, the real benefit of this approach is questionable.

Another known approach to replacing the SAW filter 20 is to replace the traditional analog IQ modulator 14 with a direct digital RF modulator, as described in the paper by Andras. P. et al., "A fully digital 65 nm CMOS transmitter for the 2.4-to-2.7 GHz WiFi/WiMax bands using 5.4 GHz $\Delta\Sigma$RF DACs," published in the ISSCC-2008, at p. 360-361 (2008). The direct digital RF modulator places a very high demand on digital-to-analog converter (DAC) for very high bit resolution and high sampling frequency. The spurious emission is still a problem, the published results to date do not appear sufficient to solve the problems in a SAW-less solution.

It is known in the art to form a resonant circuit from an inductive load, such as a balun or inductor, with a capacitor. This circuit is known in the art as an LC tank. By making the capacitor variable, the LC tank can be used to implement band pass filter that can be tuned to the desired frequency selectivity. The filter frequency response depends primarily on the Q of the passive inductive devices, which for an on-chip inductor may range from 5 to 20. Both the capacitor and inductor will exhibit errors due to process variation. For example, a relative capacitance error about +/−20% is quite common. Due to this wide variation, few designers utilize resonant LC tanks in their filter designs. LC tanks are more widely used in PLL applications, where the output frequency of an oscillator is the resonate frequency, which has a fixed m/n ratio with a reference clock frequency. In this application, the LC tank remains tuned at the desired resonate frequency as long as the loop is locked. To guarantee loop locking, however, an accurate setting is required. Different tricks are employed to achieve this, and PLLs based on LC tanks usually take a relatively longer time to lock than other designs.

SUMMARY

According to one or more embodiments disclosed and claimed herein, an LC tank resonant circuit, including an inductor and a variable capacitor, is tuned to operate at a peak RF signal output. In a tuning mode, the RF output is monitored as a variable capacitor control input is varied. A peak output is detected, and the corresponding variable capacitor control input is stored, and applied to the variable capacitor in an operating mode. In one embodiment, the variable capacitor control input is adjusted for delay in the peak detection process. In one embodiment, the variable capacitor comprises a coarse capacitor and a fine capacitor; the tuning procedure is repeated for each capacitor; and both coarse and fine variable capacitor control inputs are stored and applied to the respective capacitors in operating mode.

One embodiment relates to a method of tuning a LC tank circuit comprising an inductor and a variable capacitor, and outputting an RF signal. In a tuning mode, a control input to the variable capacitor is incremented to vary its capacitance between a minimum and maximum value; the magnitude of the RF signal is monitored as the control input increments; a peak in the RF signal is detected; and the variable capacitor control input value associated with the RF signal peak is stored. In an operating mode, the stored variable capacitor control input value is applied to the variable capacitor.

Another embodiment relates to an RF amplifier with band pass filter function. The amplifier includes an input port operative to receive an RF signal voltage and a transconductance operative to convert the input RF signal voltage into an RF current. The amplifier further includes an LC tank circuit comprising a variable capacitor receiving a control input and an inductor, and operative to amplify and output an RF voltage signal responsive to the RF current. The amplifier also includes a tuning circuit comprising a peak detector operative to detect a peak in the magnitude of the amplified RF voltage signal; a controller operative to receive a peak detection indication and operative to output the control input to the variable capacitor; and a memory element operative to store a variable capacitor control input.

DETAILED DESCRIPTION

An accurately tunable LC tank circuit has numerous applications in a variety of electronic circuits. For example, a band pass filter comprising at least one amplifier stage based on an LC tank which is tuned at a desired RF frequency can improve frequency selectivity and suppress the amplitude of unwanted interference and noise. Such filters are applicable to both transmitter and receiver circuits of mobile communication devices. A tunable LC tank may also be utilized in a very low phase noise PLL design. Representative examples of these circuits are presented herein.

The LC tank must be tuned; otherwise, it is difficult to characterize the frequency transfer function that is required to calculate the various specified performances, such as gain, noise, incoming blocker, outgoing interference, etc. Traditional tank tuning is done with a very coarse preset. It is difficult to detect and compensate the process variations which cause severe performance drops in these circuits. This inaccuracy in the tank tuning prevents the use of these circuits in multi-stage BPF and high Q filtering. The higher the Q, the more difficult it is for the tuning.

Figure 1:
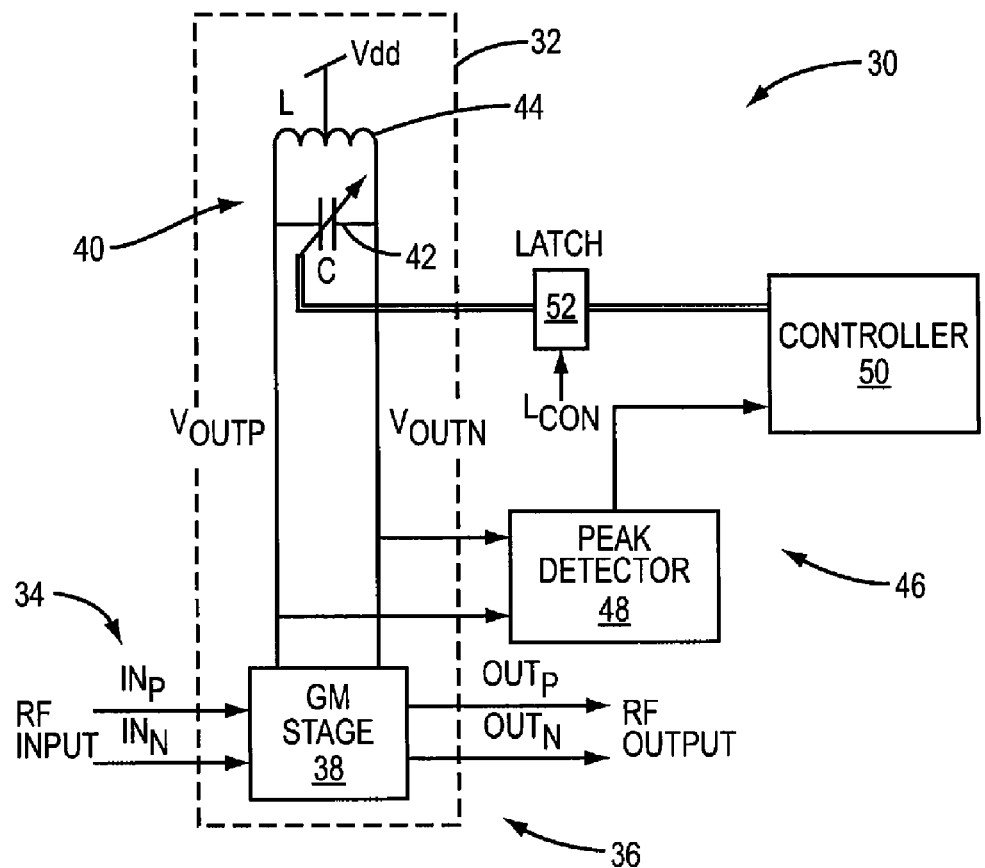
FIG. 1 is a functional block diagram of one stage of a Radio Frequency (RF) amplifier with band pass filter function.

FIG. 1 depicts a basic, single stage amplifier design 30 comprising an LC tank 40 and its tuning circuit 46. In a given application, as discussed more fully herein, multiple stages may be cascaded.

The RF amplifier 30 also comprises an amplifier stage 32. The RF input 34 and output 36 can be either single-ended or differential pair. The amplifier stage 32 provides trans-conductance $G_m$ 38 which converts the input RF signal voltage into an RF current. This current creates an RF voltage at the LC tank 40, comprising a variable capacitor 42 and an inductor 44. The RF output nodes 36, $OUT_P$ and $OUT_N$, can be connected either directly to the tank 40 nodes, $V_{OUTP}$ and $V_{OUTN}$, through a voltage divider built with capacitors or resistors (not shown), or through a balun/transformer secondary coil (not shown). The tuning circuit 46 comprises a peak detector 48, controller 50, and latch 52 that holds the variable capacitor 42 control input. The peak detector 48 and controller 50 may be dedicated to a single amplifier stage 32, or may be shared by two or more stages 32, as the tuning of a tank 40 in each stage 32 is performed separately.

Figure 2:
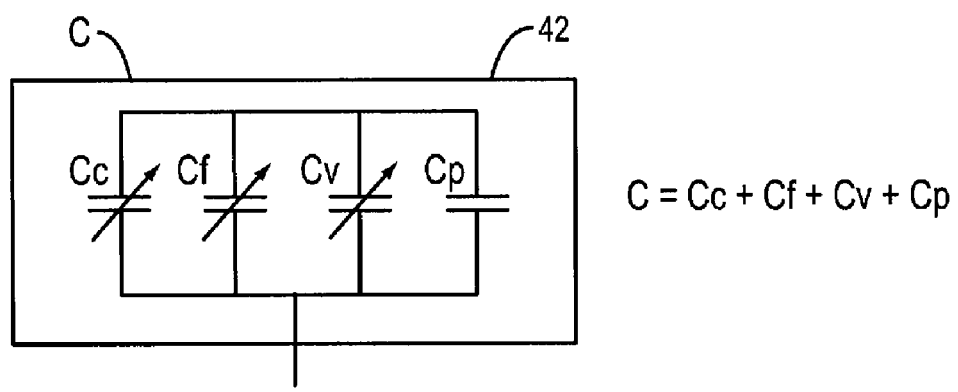
FIG. 2 is a functional schematic diagram of the variable capacitor of FIG. 1.

FIG. 2 depicts the variable capacitor 42. The capacitor 42 comprises a coarse variable capacitor $C_c$, a fine variable capacitor $C_f$, an optional varactor $C_v$, and total parasitic capacitance $C_p$. The variable capacitor 42 may be symmetric, for use with a differential LC tank 40, or nonsymmetric, for use with a single-ended tank 40.

Figure 3A:
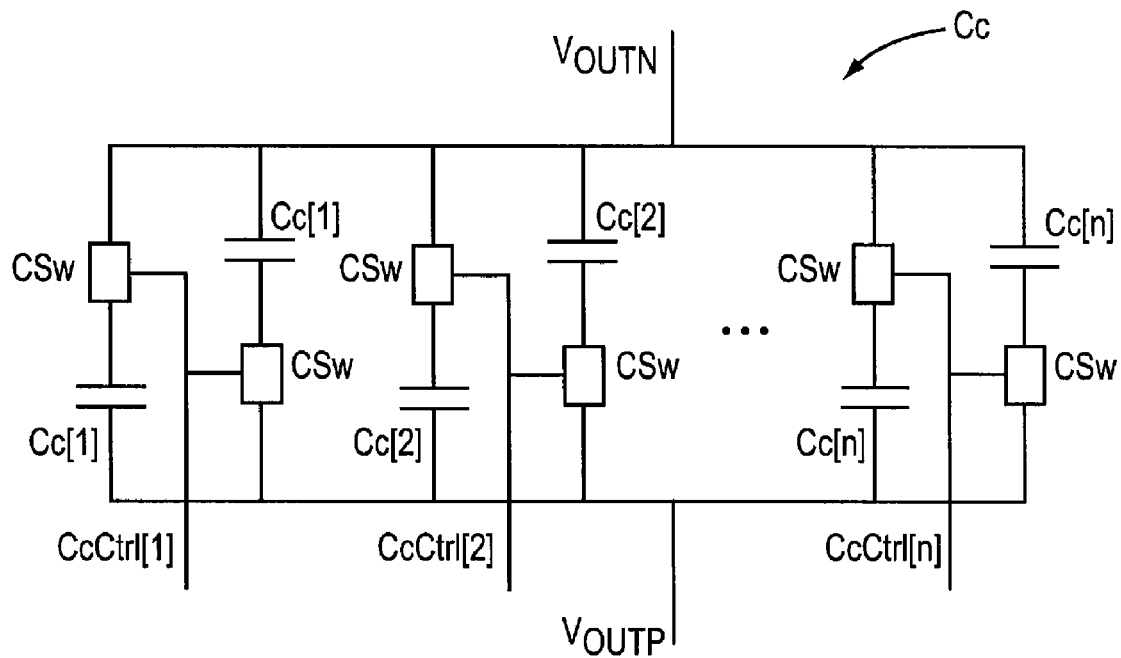
FIG. 3A is a functional schematic diagram of the variable coarse capacitor of FIG. 2.

FIG. 3A depicts a representative implementation of a symmetric coarse variable capacitor $C_c$. The total capacitance $C_c$ is twice the sum of the enabled capacitors $C_c[i]$, $i=1, 2, \ldots, n$. The devices CSw are MOS switches, controlled by the digital control signals $C_cCtrl[i]$. In one embodiment, when a bit of $C_cCtrl[i]$ is high, the corresponding switch is enabled, and the corresponding capacitor $C_c[i]$ contributes to the total coarse capacitance $C_c$. If the bit of $C_cCtrl[i]$ is low, the capacitor $C_c[i]$ is disabled. The capacitances $C_c[i]$ may be binary weighted, in which case the control input $C_cCtrl[i]$ is a binary value. Alternatively, the capacitances $C_c[i]$ may be evenly weighted, in which case the control input $C_cCtrl[i]$ is a thermal-meter control vector converted from a binary control word. In either case, the coarse capacitance $C_c$ can be set from 0 to $C_{cmax}$ as the control input $C_cCtrl$ varies from 0 to the maximum $C_cCtrl_{max}$ with a step of $C_{cd}$. In practice, when $C_cCtrl$ is set to 0, the parasitic capacitance still exists, but its contribution can be taken into account in capacitor $C_p$.

Figure 3B:
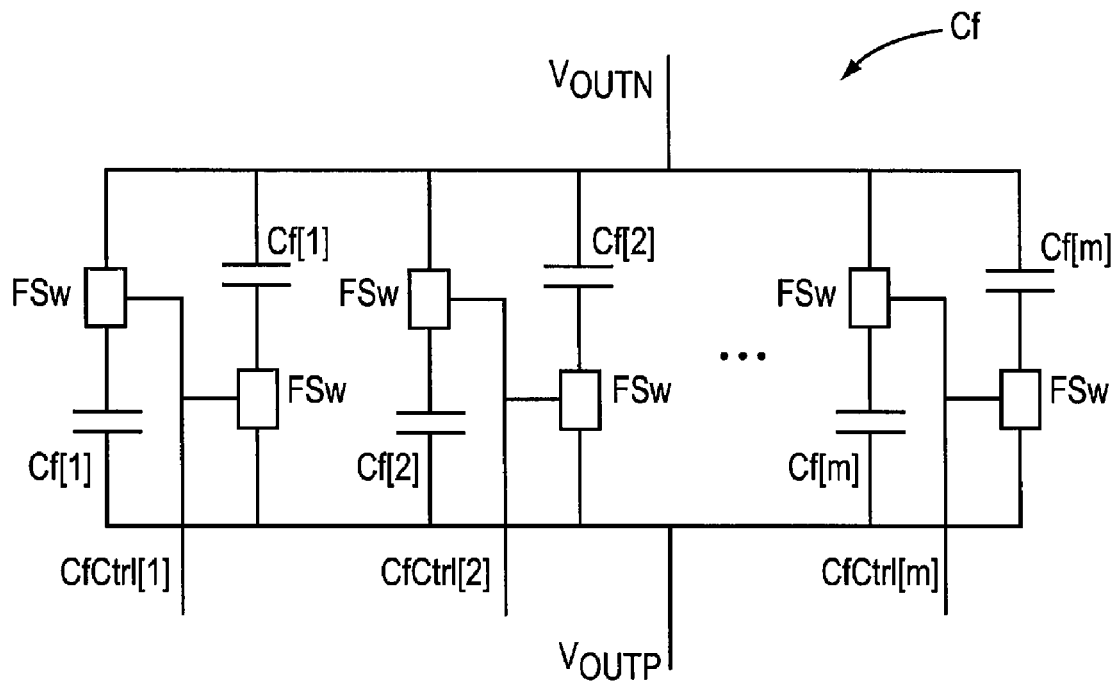
FIG. 3B is a functional schematic diagram of the variable fine capacitor of FIG. 2.

Similarly, FIG. 3B depicts a representative implementation of a symmetric fine variable capacitor $C_f$. The total capacitance $C_f$ is twice the sum of the enabled capacitors $C_f[j]$, j=1, 2, . . . , n. The devices FSw are also MOS switches with smaller size than the switches CSw, and are controlled by the digital control signals $C_fCtrl[j]$. When a bit of $C_fCtrl[j]$ is high, the corresponding capacitor $C_f[j]$ is enabled; otherwise, it is disabled. The capacitances of $C_c[j]$ may binary or evenly weighted, and are smaller than $C_c[i]$ (i and j being integers). The fine capacitance $C_f$ can be set from 0 to $C_{fmax}$ as the control input $C_fCtrl$ varies from 0 to the maximum $C_fCtrl_{max}$. In practice, when $C_fCtrl$ is set to 0, the parasitic capacitance still exists, but its contribution can be taken into account in capacitor $C_p$.

To guarantee that tuning can cover all frequencies in a defined tuning range, $C_{fmax}$ must be larger than the maximum step of $C_{cd}$, so that control words $C_cCtrl$ and $C_fCtrl$ can form at least n overlapped regions in the desired frequency range.

An additional fine tuning of capacitance C can be implemented by tuning the varactor $C_v$. In one embodiment, $C_v$ is tuned through a digital-to-analog converter that creates a control voltage for the varactor bias from the control word $C_fCtrl$. At different bias voltages, the varactor yields different capacitances, thus changing the tuning. The adjustable capacitance of $C_v$, i.e., $C_{vmax}-C_{vmin}$, should be larger than the maximum step $C_{cd}$ in order to cover the whole tuning range.

Figure 4:
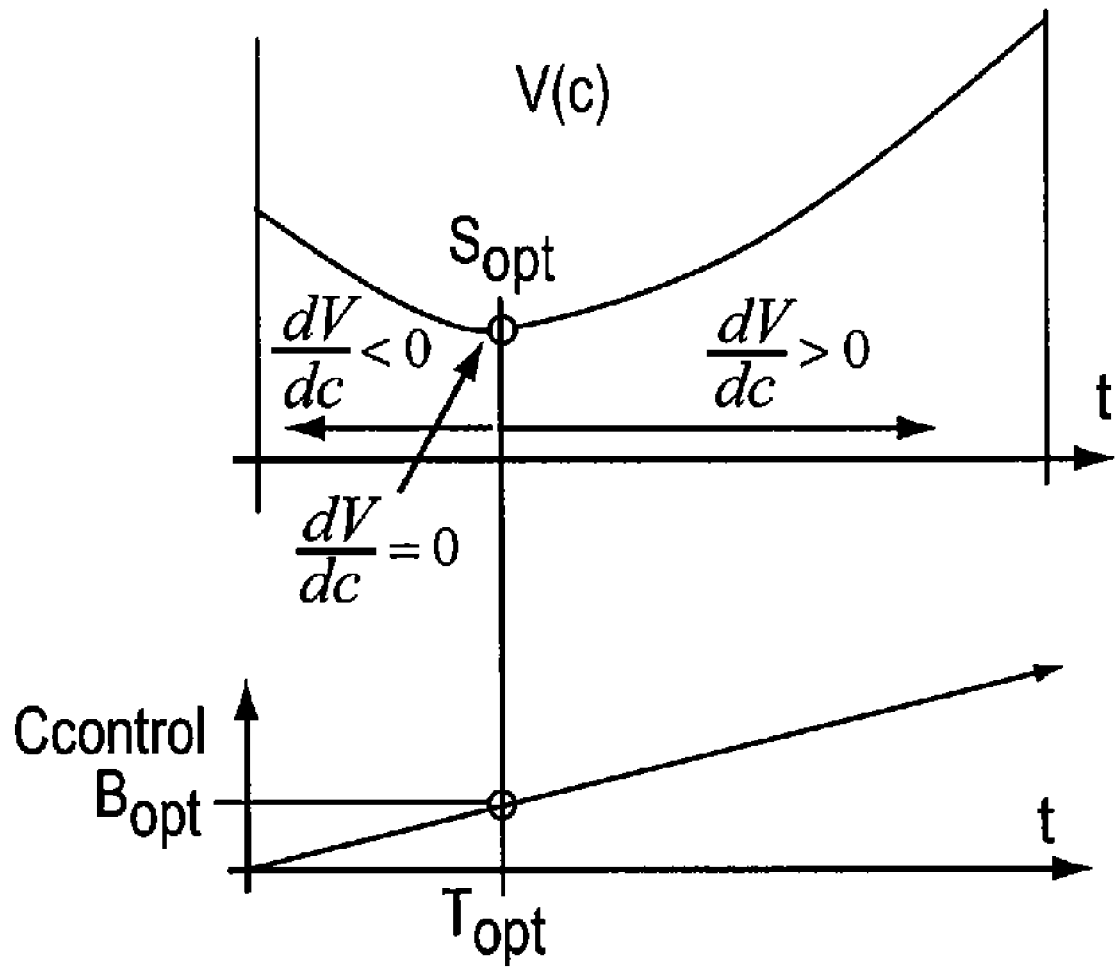
FIG. 4 depicts two graphs of RF output as a variable capacitor control input is varied.

To illustrate the concept of tank tuning, a control voltage, $C_{control}$, in either digital or analog form, is used to tune the capacitance C. FIG. 4 illustrates a search method to determine the maximum output voltage when an RF detector output voltage, V(C), that is the negative envelope of the RF signal, reaches a minimum. The capacitor control input $C_{control}$ is linearly increased with scan time, t, either in a digital or analog format. Therefore, the capacitance C can be represented as $C=C_0+C_{control}*C_1=C_0+t*C_2$, where first item $C_0$ is the constant part of C and the second part is the variable part of C versus control voltage $C_{control}$, which is also a linear function of time, t. Here $C_1$ and $C_2$ are the slope of capacitances versus control voltage and time, respectively. From FIG. 4, it is easy to see that in the time region [0, $T_{opt}$), the gradient V(C) versus time (or C) is negative, and in the time of ($T_{opt}$, $T_{max}$], the gradient V(C) versus time (or C) is positive. Only at moment of $t=T_{opt}$, where the gradient V(C) versus time (or C) is zero, does the control input equal $B_{opt}$, as described in the prior method—that is, where V(C) reaches its minimum. The scan function can be easily implemented with a digital counter, having clock, reset, and enable inputs. The counter is reset when the tuning procedure begins, and is disabled when the tuning procedure is complete. During the tuning period, the counter increments following a reset, forming a linear scan. The same counter can be used for both coarse and fine phases of the LC tank tuning procedure.

Figure 5:
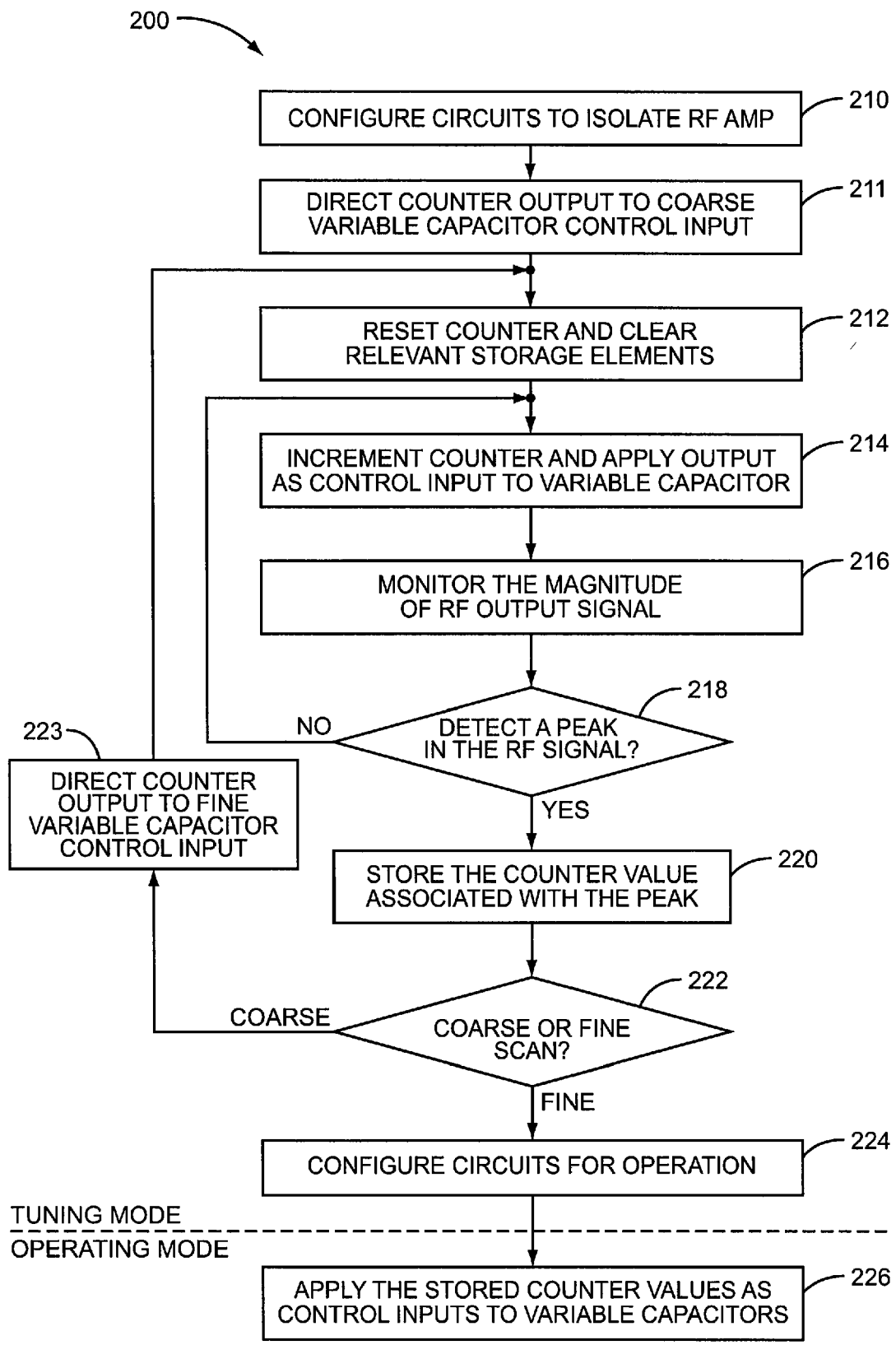
FIG. 5 is a flow diagram of a method of tuning a LC tank circuit.

FIG. 5 depicts the RF tank tuning procedure 200. Initially, the circuit in which the RF amplifier 30 is deployed is configured for tuning (block 210). For example, if the RF amplifier 30 forms a band pass filter in a transmitter, the power amplifier of the transmitter should be disabled to prevent broadcasting the signals applied during the tuning procedure. During tuning in a receiver, the LNA input would be coupled to an LO signal. Those of skill in the art can readily isolate the RF tank 40 for tuning, or calibration, in a manner that does not adversely impact the circuit(s) in which the tank 40 is deployed.

To begin the tuning procedure, the counter, control signals, and memory elements are reset (block 212)—e.g., set $C_cCtrl=C_fCtrl=0$. Initially, all memory elements are cleared as well. A coarse scan procedure is initiated by incrementing the counter, and applying the output as the coarse variable capacitor control input $C_cCtrl$ (block 214). A peak detector 48 looks for an optimal point $B_{opt}$ in the RF output signal (block 216). If it is found (block 218), then the corresponding $C_cCtrl$ value is recorded (block 220). Otherwise (block 218), the counter is incremented (block 214) and the RF output again monitored (block 216).

After the counter value yielding the optimal RF output, when applied as the coarse variable capacitor control input, is found and recorded (block 220), a fine scan procedure then begins (block 222). The counter and control signals are reset (block 212). The counter value is incremented and its output applied as the fine variable capacitor control input $C_fCtrl$ (block 214). The peak detector 48 again looks for an optimal point $B_{opt}$ (block 216). When it is found (block 218), then the corresponding $C_fCtrl$ value is recorded (block 220). After the tuning procedure is complete, the circuits are placed in an operating mode (block 224), the stored value $C_cCtrl$ is applied to the coarse variable capacitor $C_c$, and the stored value $C_fCtrl$ is applied to the fine variable capacitor $C_f$, in an operating mode (block 226).

Figure 6:
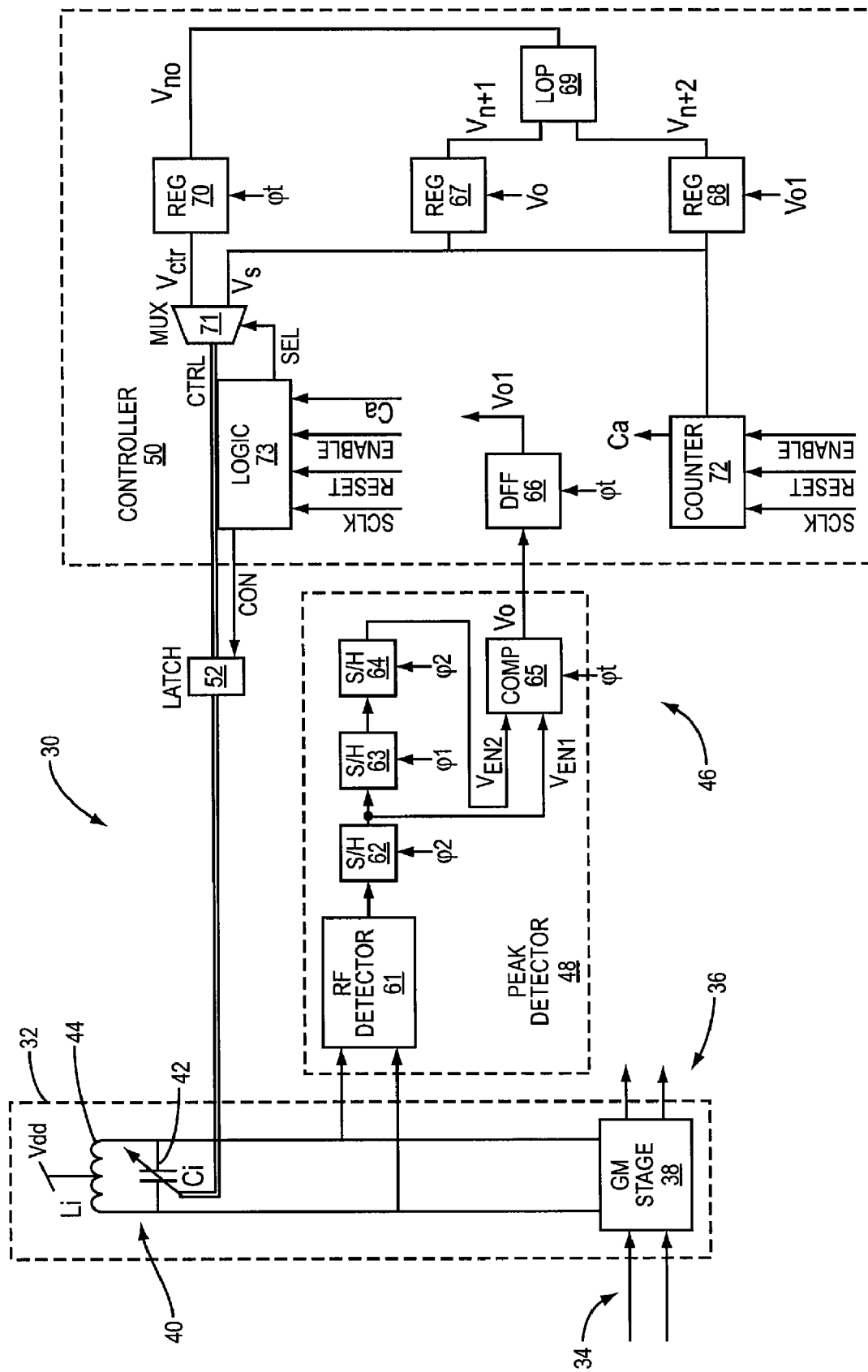
FIG. 6 is a functional block diagram of the RF amplifier with band pass filter function of FIG. 1, according to one embodiment of the present invention.

FIG. 6 depicts details of the tuning circuit 46 of a tunable RF amplifier 30, according to one embodiment. The peak detector 48 comprises an RF detector 61, three sample-and-hold modules 62, 63, and 64, and a comparator 65. These components are triggered by a sampling clock at frequency $f_s$, with two non-overlapped clock phases φ1 and φ2. The RF detector 61 converts the RF signal amplitude from the LC tank 40 into its envelop $V_{EN}$, and $V_{EN}$ is sampled as $V_{EN1}$ at S/H module 62 in phase φ2. S/H modules 63 and 64 capture $V_{EN2}$, which is one clock period delay from $V_{EN1}$. The comparator 65 then makes a comparison between $V_{EN1}$ and $V_{EN2}$. Assuming $V_{EN1}$ is initially greater than $V_{EN2}$ (that is, the RF tank 40 output V(C) has a negative slope, see FIG. 4), the comparator 65 will output a rising edge of a pulse at the moment when $V_{EN1}$ becomes less than $V_{EN2}$—that is, just past the minima at $S_{opt}$. In order to reduce probability of mistake-toggle, a positive feedback can be introduced in the comparator to provide a hysteresis in the inputs which maintains some memory function of the previous state.

Figure 7:
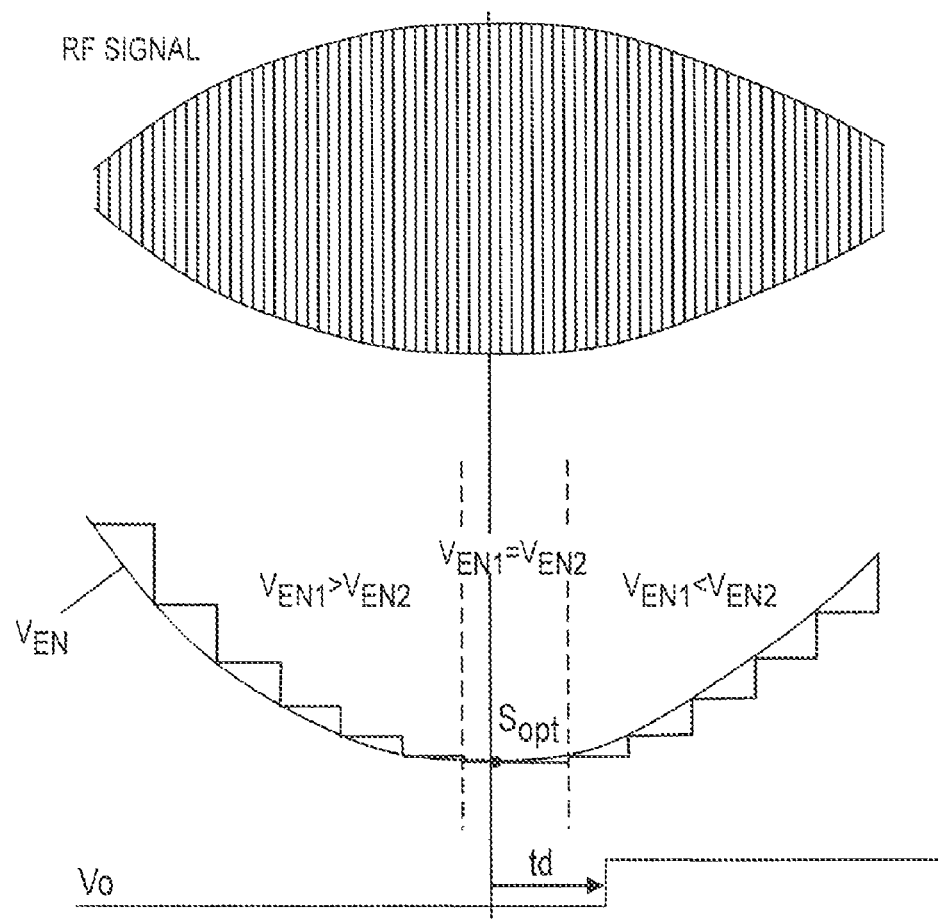
FIG. 7 is a graph of RF output and voltage at a detector in the amplifier with band pass filter function of FIG. 6.

FIG. 7 illustrates the peak detector 48 operating principle. Assume the negative envelop $V_{EN}$ of the RF signal is detected by S/H module 61, as shown, and the minimum point $S_{opt}$, corresponding to the point where the RF signal reaches its peak. From left side of $S_{opt}$, $V_{EN1}>V_{EN2}$2, and on right side of $S_{opt}$, $V_{EN1}<V_{EN2}$. When a tank is attached to an RF amplifier, the amplifier will have a peak response in frequency domain and then form a band pass filter. In such case, a region where $V_{EN1}=V_{EN2}$ must exist. The goal is to detect the inflection point at which slope of $V_{EN}$ changes from negative to positive. The comparator 65 output presents a rising edge which represents the gradient change, but with a delay, $t_d$. This delay is mainly caused by the sampling clock that is discrete in time, and the positive feedback also contributes a small portion of delay. This delay causes an error in creating the variable capacitor control input, which must be compensated in the controller 50.

Figure 8:
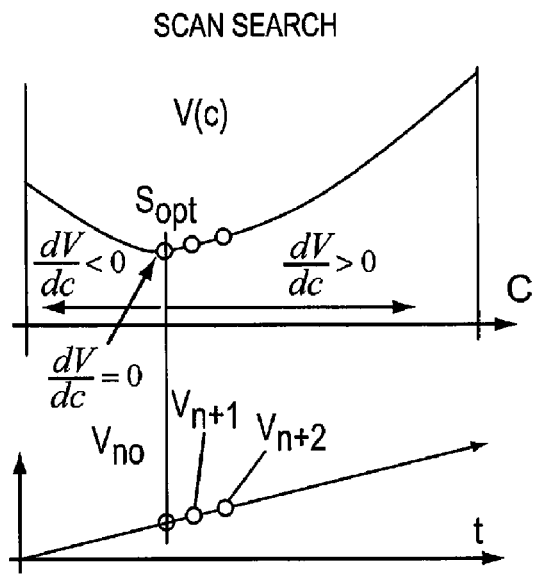
FIG. 8 is a graph depicting an RF output peak search performed by the circuit of FIG. 6.

FIG. 6 also depicts details of a controller 50, according to one embodiment. The controller 50 comprises a digital counter 72, three registers (memory elements) 68, 67, and 70, a linear operation processor (LOP) 69, a multiplexer 71 with control logic 73, and a D-flip-flop (memory element) 66. The counter 72 has a clock, a reset and an enable input. The clock SCLK is $2^j$ times higher than the sampling clock $f_s$, where j=0, 1, 2, . . . . When j=0, SCLK has the same frequency as $f_s$, in this case SCLK can be the clock signal phase $\phi 2$. At the beginning of a tuning procedure, the counter 72 is reset to zero. It counts the number of pulses of input clock SCLK, which is a linear scan voltage $V_S$ in a digital format, either in a binary or a thermal-meter coded control word Ctrl. The capacitance of the variable capacitor 42 will change as the control input Ctrl changes, yielding a changing output V(C) of the RF signal with the scan, as depicted in FIG. 8. Based on this RF output signal, the peak detector 48 will generate a rising edge in output $V_o$ at time $t_{opt}+t_d$, and the register 67 latches the scan voltage $V_{n+1}$ at its output. Similarly, the register 68 latches the scan voltage $V_{n+2}$ at its output, which is one clock cycle delayed from the sampling of $V_{n+1}$. Since the scan voltage is linear versus time, $V_{no}$ can be calculated back from $V_{n+1}$ and $V_{n+2}$.

In general, we can have $$V_{no}=V_{n+1}-k\Delta=V_{n+1}-k(V_{n+2}-V_{n+1})=(k+1)V_{n+1}-kV_{n+2}$$

Where, k is a positive number, corresponding to the number of delays from the time $t_{opt}$ where the RF signal reaches its peak. So the error caused by delay can be partly removed in this manner. The above linear operation is executed in the LOP 69, and the output $V_{no}$ is latched by clock $\phi t$ to create $V_{ctr}$. The clock phase $\phi t$ is a delayed version of $\phi 1$, in order to have correct timing in latching the inputs.

The multiplexer MUX 71 selects $V_S$ during a scan (tuning) period when the MUX 71 select signal SEL is logic low, and selects $V_{ctr}$ during an operation period when the select signal is logic high. The function of the control logic 73 is to create control signals for latches, such as LATCH 52, and the multiplexer MUX 71. The enable input to the control logic 73, which indicates whether to apply a scanning variable capacitor control input $V_S$ during tuning, or a calculated value $V_{ctr}$ during operation, can be created inside the controller 50, or provided by external controller such as a baseband processor.

Figure 9:
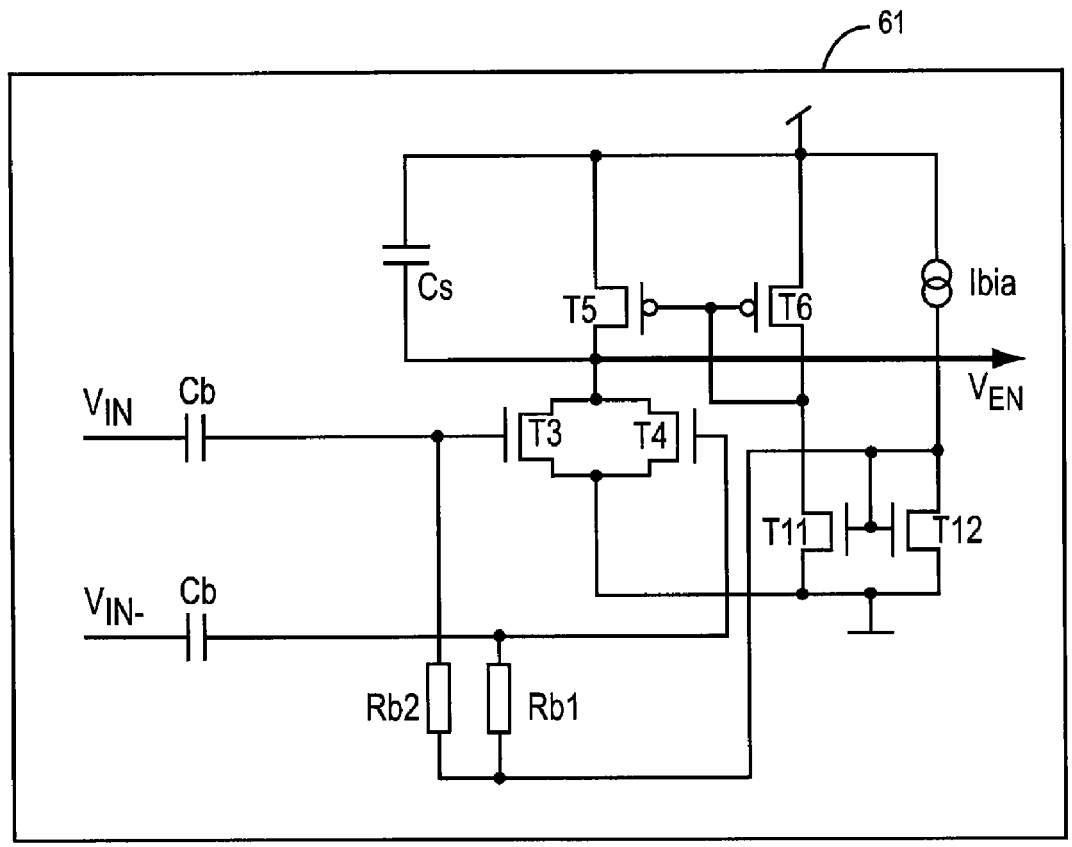
FIG. 9 a functional schematic diagram of the RF detector circuit of the amplifier with band pass filter function of FIG. 6.

FIG. 9 depicts one embodiment of the RF detector 61. The NMOS transistors T3 and T4 are biased at sub-threshold voltage region through resistors $R_{b1}$ and $R_{b2}$, and PMOS transistor T5 forms an active load to T3 and T4. The transistors T3 and T4 work like a rectifier, conducting only during a positive half-cycle of the RF signal, thus on the output node $V_{en}$, an envelop of the RF signal is obtained. When a single tone sinusoid RF signal is applied at inputs $V_{IN+}$ and $V_{IN-}$, $V_{EN}$ becomes a DC voltage. Capacitor Cs and T5 form a low pass filter which removes the ripple of the RF signal from $V_{EN}$. Transistors T6, T11 and T12 create a bias for the rectifier transistors T3 and T4.

Figure 10:
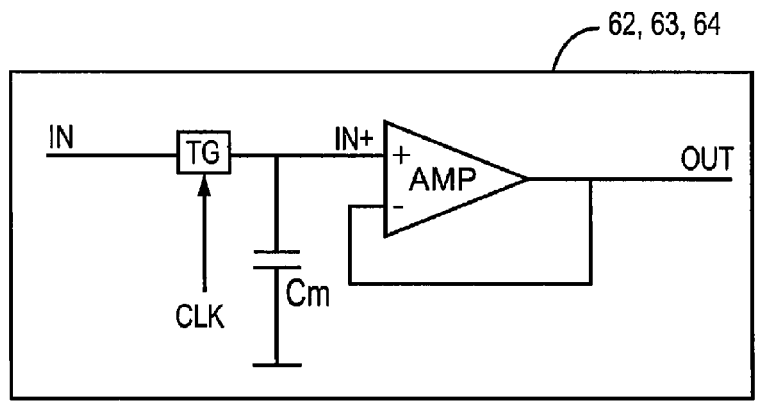
FIG. 10 is a functional schematic diagram of the sample and hold circuit of the amplifier with band pass filter function of FIG. 6.

FIG. 10 depicts one embodiment of the Sample-and-Hold modules 62, 63, 64. The transmission gate TG is clocked by a CLK signal, and Cm is sampling capacitor. Here we assume a positive logic, such that when CLK is logic high TG conducts and starts to charge the capacitor Cm in the sampling period. When CLK signal is logic low, TG is disconnected hence it holds the previous voltage saved on the capacitor Cm. Of course the S/H module 62, 63, 64 will also work if a negative logic is used, i.e., when CLK is logic low, it starts sampling period, and when CLK is logic high it holds the previous state. The differential amplifier AMP senses the difference between OUT and IN+, and through the feedback it removes the error between IN+ and OUT.

Figure 11:
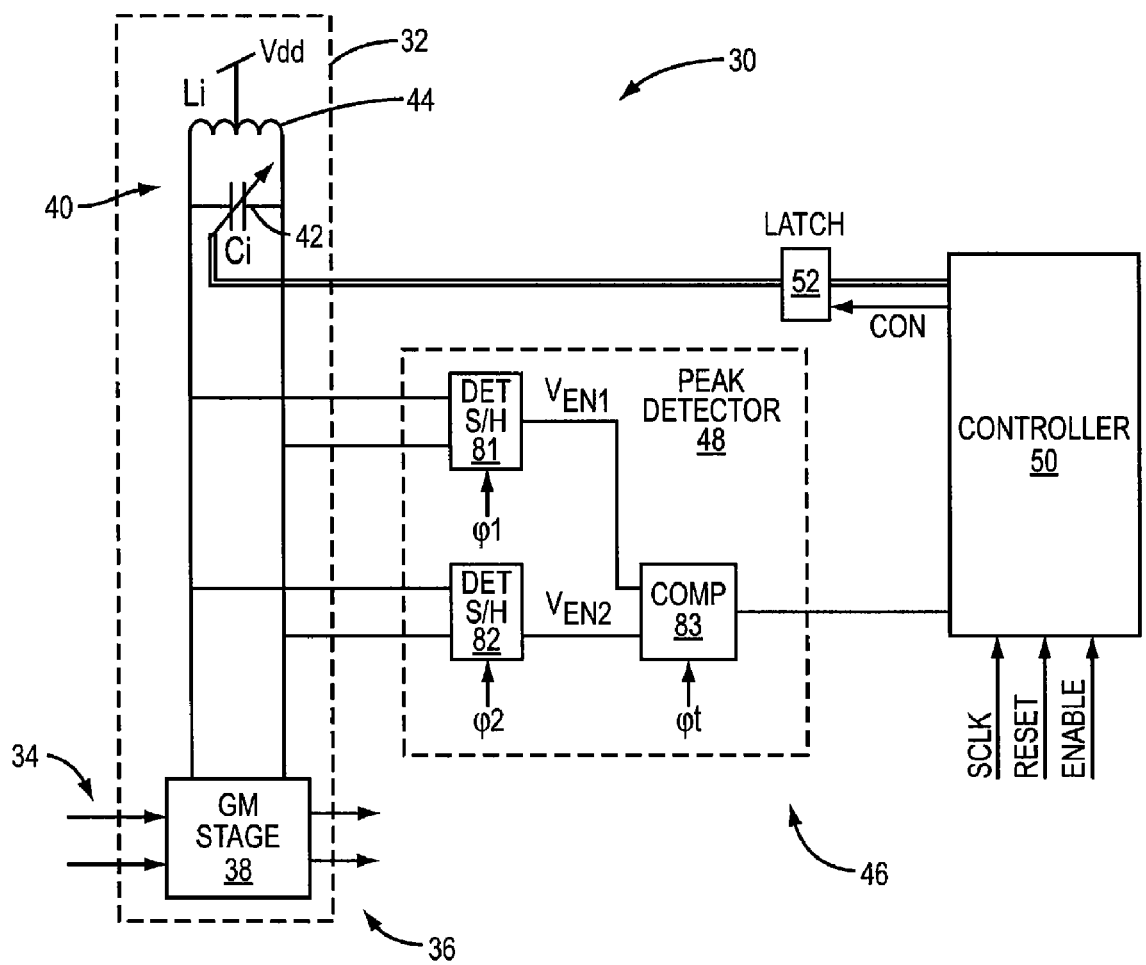
FIG. 11 is a functional block diagram of the RF amplifier with band pass filter function of FIG. 1, according to another embodiment of the present invention.

FIG. 11 depicts another embodiment of a single stage RF amplifier 30 featuring a tunable LC tank 40. The difference between this embodiment and that depicted in FIG. 6 is in the construction of the peak detector 48. Instead of using a separate RF detector 61 and S/H modules 62, 63, 64, the RF detection and the S/H functionality are merged in modules 81, 82.

Figure 12:
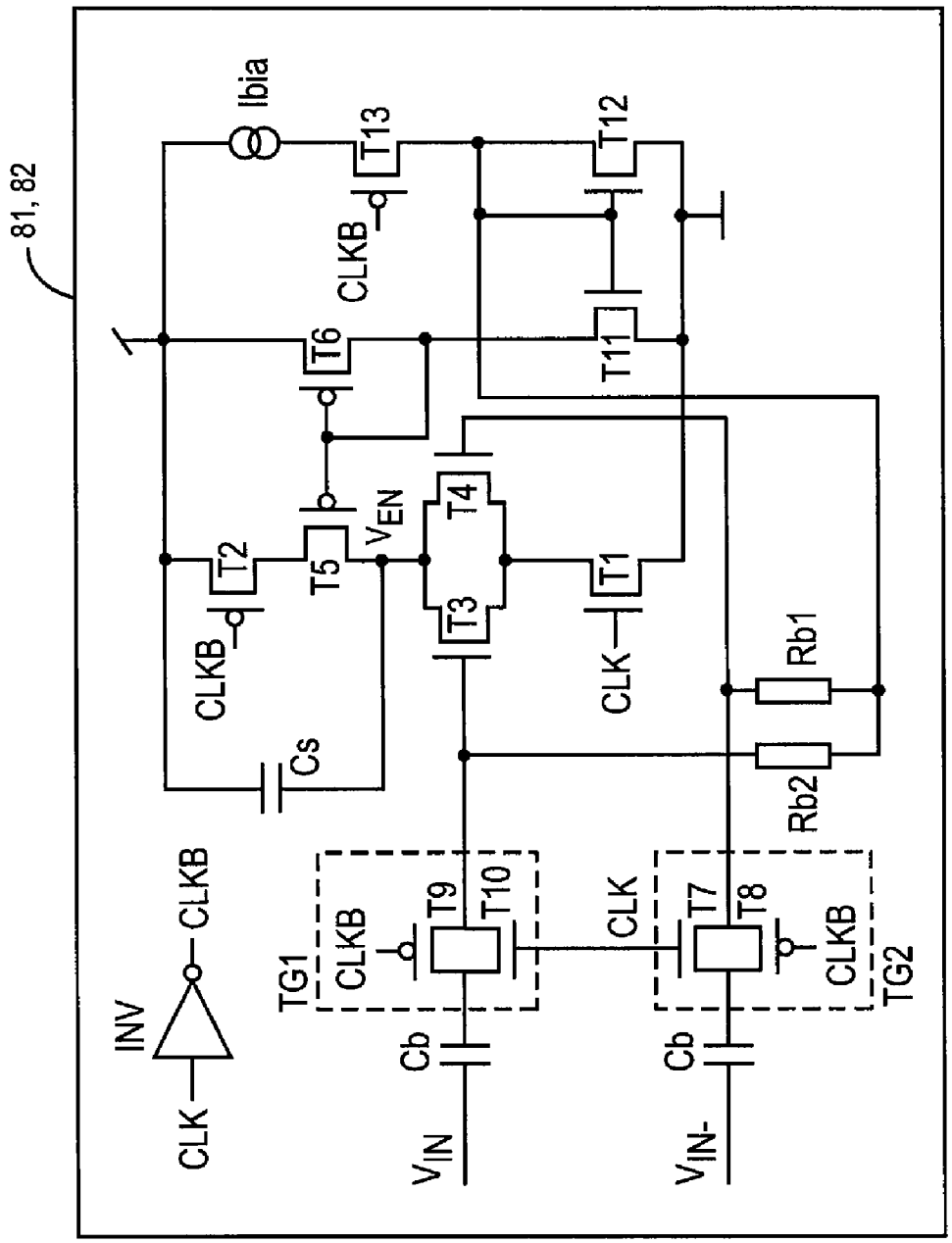
FIG. 12 is a functional schematic diagram of the combined RF detector and sample/hold circuit of the amplifier with band pass filter function of FIG. 11.

Details of these modules are depicted in FIG. 12. Two transmission gates, TG1 and TG2, are built with the transistors T7, T8, T9 and T10, and the inverter INV. The Sample-and-Hold function is moved from the RF detector output to its input and biasing. The bias becomes zero during hold period due to the transistor T13, and a normal weak bias during the sampling period, respectively. In addition, transistors T2 and T1 only conduct in the sampling period, when the CLK signal is logic high. T2 and T1 will disconnect in the hold period, when the CLK signal is logic low, preventing discharge of Cs.

Figure 13:
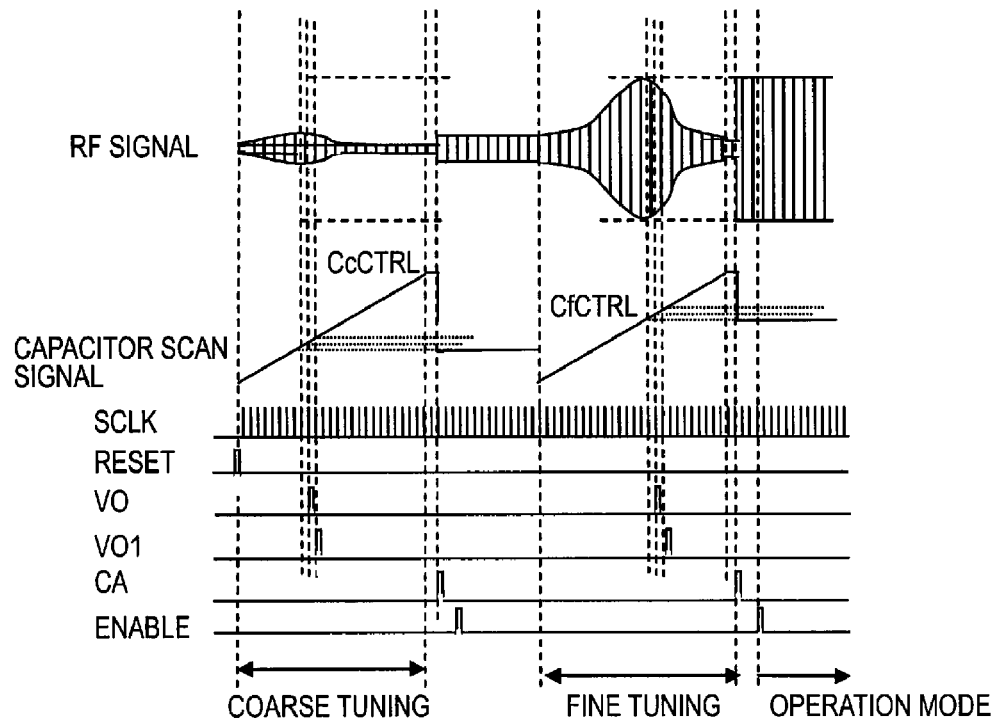
FIG. 13 is a graph of RF output during scans of the coarse and fine variable capacitor control inputs during a calibration procedure according to one embodiment of the present invention.

FIG. 13 depicts waveforms of a representative tank tuning operation for a single stage RF amplifier 30. The peak detector 48 and controller 50 are used in both coarse tuning and fine tuning, except that the controlled capacitors are changed from $C_c$ to $C_f$, respectively. If the fine tuning is implemented with a varactor $C_v$, there is an additional digital-to-analog converter (DAC) interposed between the varactor $C_v$ and the digital control word CfCtrl. The enable signal generates the control signals that latch the variable capacitor control input during tuning. The enable signal can be generated inside the controller 50, or externally.

As FIG. 13 depicts, the maximum RF signal output is detected as the variable capacitor control input signal $C_c$CTRL is varied linearly from zero to $C_c$CTRL$_{max}$. The maximum is captured by comparison of successively latched values, and hence lags the actual maximum by a few cycles, which are removed in the controller 50. At the end of the coarse tuning procedure, the calculated optimal value of $C_c$CTRL is latched and applied to the coarse variable capacitor $C_c$. This sets the RF signal output at its maximum value during the coarse tuning scan. The counter 72 and other circuits in controller 50 are reset, and the fine tuning scan begins by incrementing the variable capacitor control input signal $C_f$CTRL linearly from zero to $C_f$CTRL$_{max}$. Similarly, the maximum RF signal output is detected and captured, and the timing adjusted. The calculated optimal value of $C_f$CTRL is latched and applied to the fine variable capacitor $C_f$. The full functional circuit, of which the RF amplifier 30 is a part, is then activated, with the RC tank 40 outputting the maximum RF signal.

Figure 17:
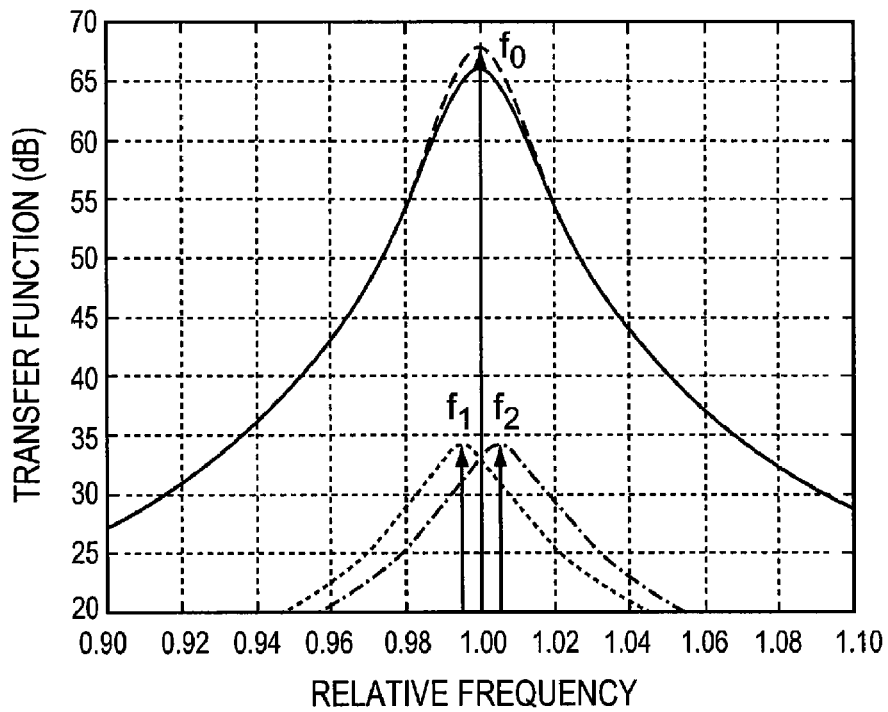
FIG. 17 is a graph of the combined frequency response of two RF amplifier and band pass filter stages.
Figure 18:
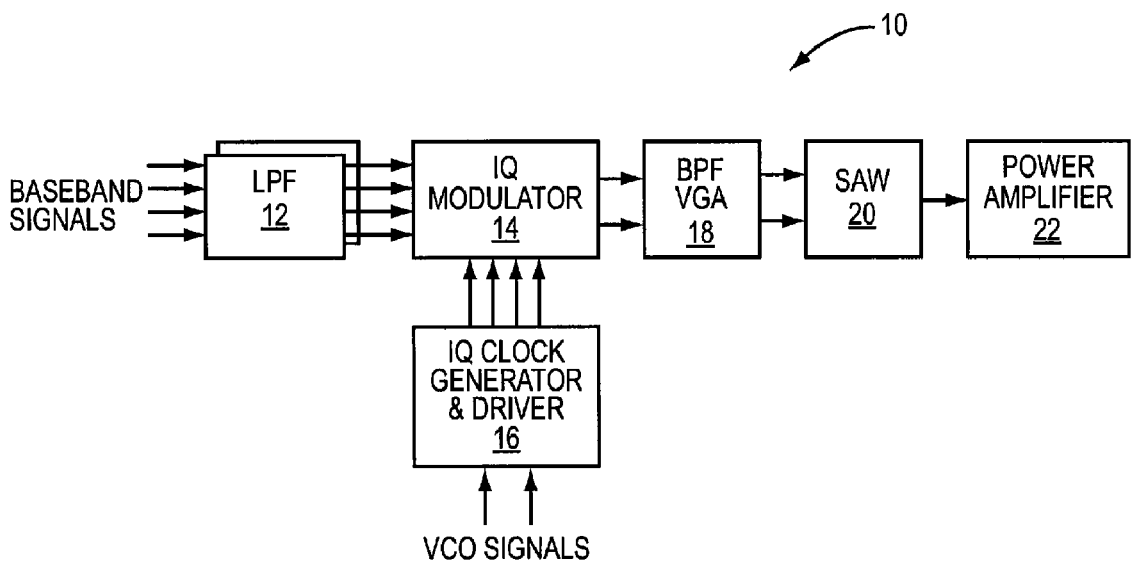
FIG. 18 is a functional block diagram of a prior art RF transmitter.

For a multistage band pass filter, the LC tank tunings can be done either at one frequency $f_0$ or at several different frequencies. The former is suitable for narrow band filtering, and the latter is better for wide band filtering where the overall frequency transfer function is flatter in the pass band than single-frequency-tuned filters. For example, for a two-stage tank tuning, the separate-frequency transfer function is plotted in the dashed line in FIG. 17, while the one for plural frequencies is plotted in the solid line, where one of the stages is tuned at $f_1$ (dotted line) and the other is tuned at $f_2$ (dash-dotted lines). In this case for the tuning, an RF clock frequency $f_1$ is created by a PLL as the input RF signal for the first tank tuning, then the second RF clock frequency $f_2$ is also created by the PLL as the input RF signal for the second tank tuning.

Figure 14:
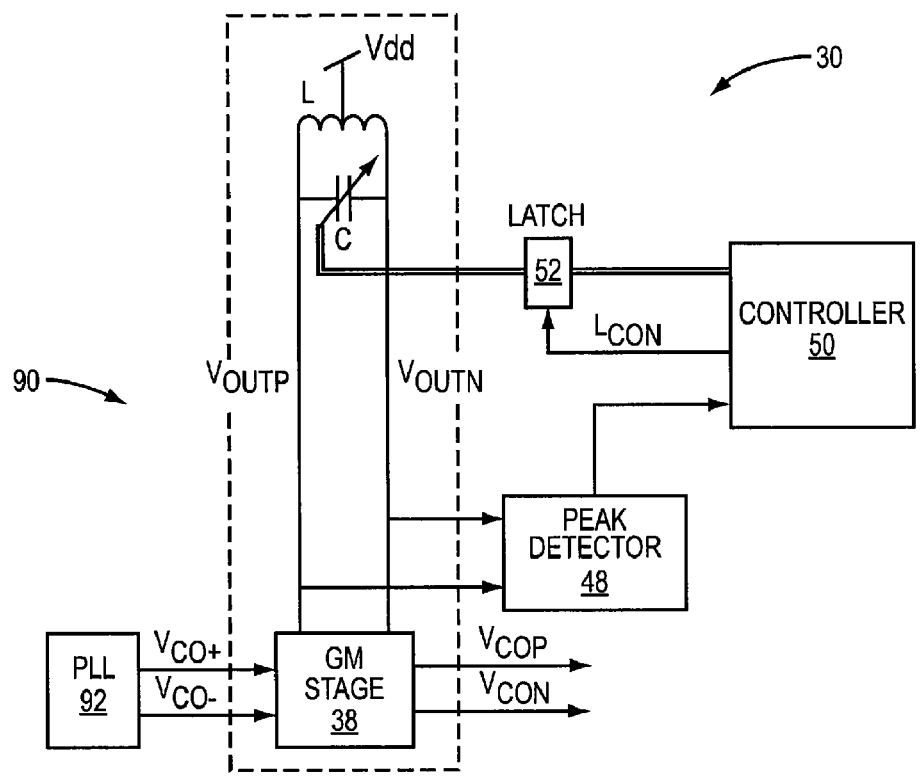
FIG. 14 is a functional block diagram of a clock driver with band pass filter function to drive capacitive load and suppress phase noise of phase locked loop employing an RF amplifier with band pass filter function according to one embodiment of the present invention.
Figure 15:
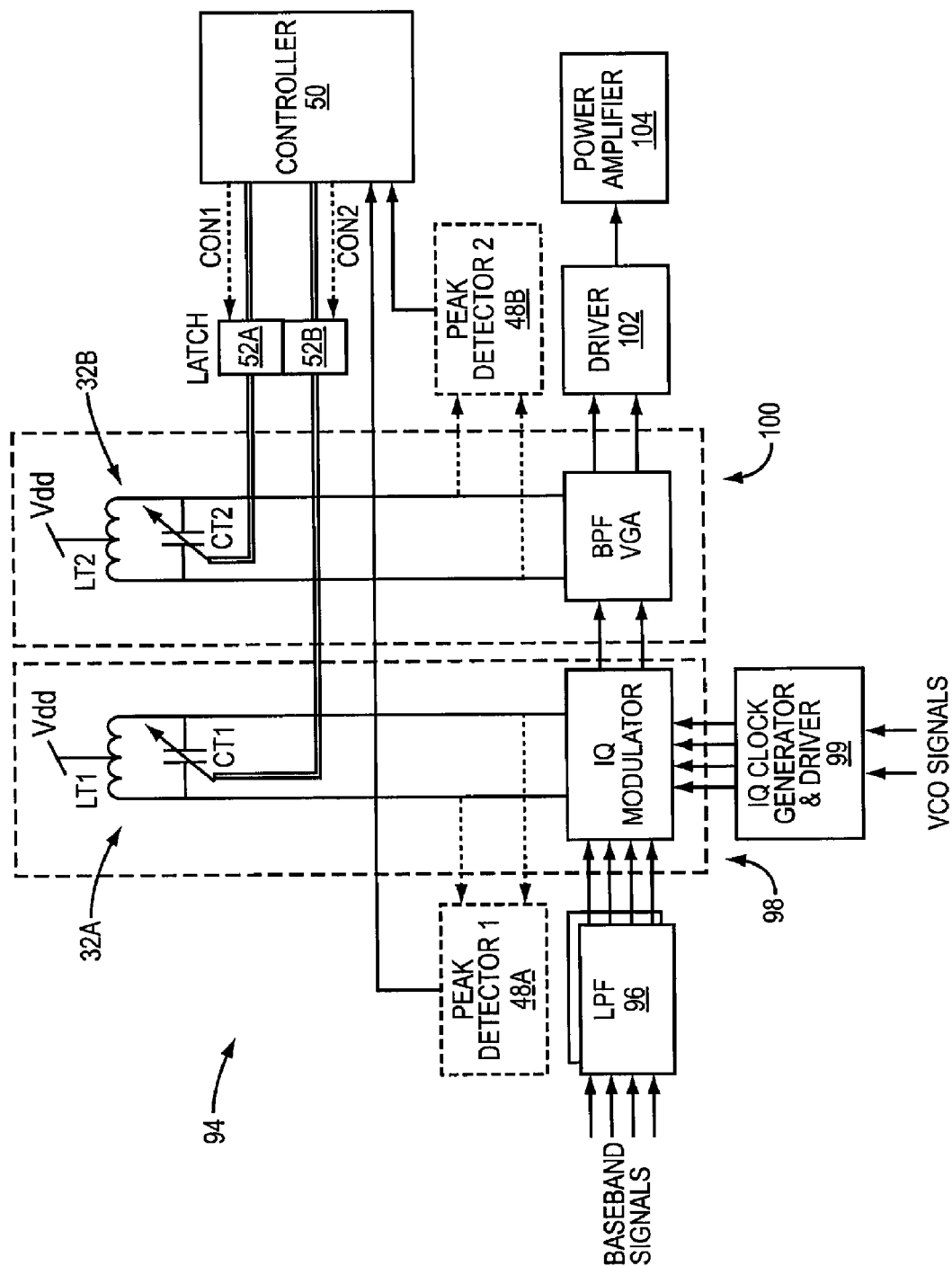
FIG. 15 is a functional block diagram of a SAW-less RF transmitter employing an RF amplifier with band pass filter function according to one embodiment of the present invention.
Figure 16:
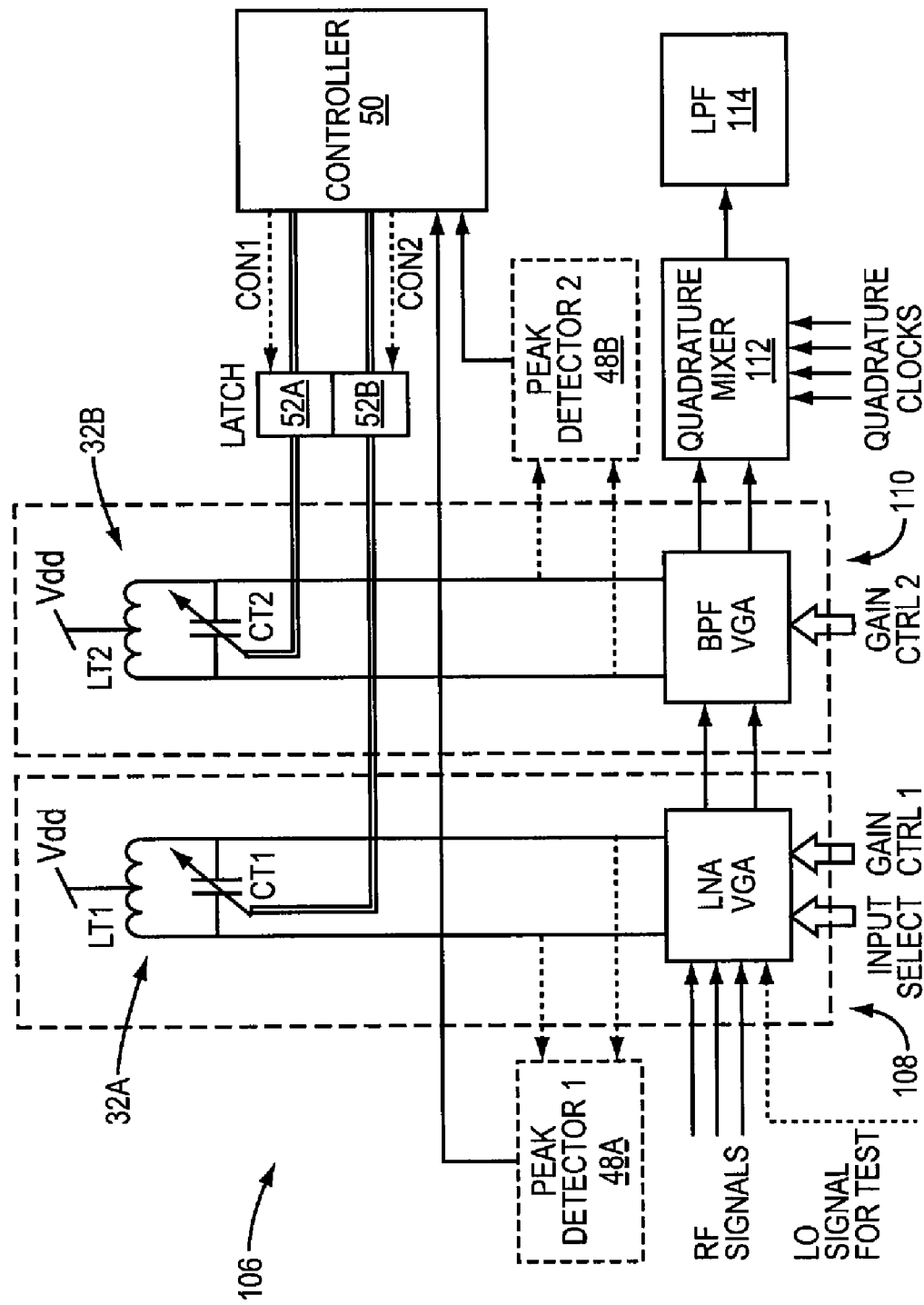
FIG. 16 is a functional block diagram of an RF receiver employing an RF amplifier with band pass filter function to suppress interference according to one embodiment of the present invention.

Although the present invention has been described herein with reference to a single stage, stand-alone RF amplifier 30 for clarity, those of skill in the art will readily recognize that it has applicability in a wide range of high frequency resonant circuits, and that numerous stages may be advantageously cascaded. As non-limiting examples, FIG. 14 depicts a Phase Locked Loop circuit with a tunable tank RF amplifier 30 as a clock driver and band pass filter to suppress phase noise of the Voltage Controlled Oscillator (VCO) in the PLL. FIG. 15 depicts a transmitter 94, such as may be used in a wireless communication system mobile terminal. Both an IQ modulator 98 and a Band Pass Filter/Variable Gain Amplifier (BPF/VGA) 100 are constructed using tunable tanks 32A and 32B, respectively. Note that in a multi-stage implementation as depicted in FIG. 15, the tunable tanks 32A, 32B may share the controller 50. However, each operates with separate peak detectors 48 and latches 52. In other embodiments, a single peak detector 48 may be shared between IQ modulator and two or more BPF/VGAs, and/or two or more BPF/VGAs may access separate controllers 50. The band pass filter suppresses the noise leaking into the receiver, hence SAW filter is not needed. FIG. 16 depicts a receiver 106, such as may be used in a wireless communication system mobile terminal. Both Variable Gain Low Noise Amplifier 108 and a Band Pass Filtering Variable Gain Amplifier 110 are constructed using tunable tanks 32A and 32B to reduce impact of interference an block signals.

Tunable LC tank resonant circuits may have particular applicability for deployment in transmitters 94 and receivers 106 in mobile communications equipment, as they may reduce or eliminate the need for expensive, dedicated-frequency SAW devices. By tuning the LC tanks 40, precise quantities about each individual circuit, such as frequency, gain, and the like, can be ascertained, as the tuning process eliminates the deleterious effects of wide process variations. Furthermore, the tank tuning procedure—either the full coarse+fine tuning or just the fine tuning—may be advantageously performed during operation, such as upon "waking" from a "sleep" or battery-conservation mode, to adjust for temperature drift and similar operational factors.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of tuning a LC tank circuit, and outputting a radio frequency (RF) signal responding to an input RF signal, the LC tank circuit comprising an inductor and a variable capacitor having independently variable coarse and fine capacitances wherein the coarse capacitance is greater than the fine capacitance, the method comprising:
   in a coarse phase of a tuning mode,
      incrementing/decrementing a control input to the coarse variable capacitor to vary its capacitance between a minimum and maximum value;
      monitoring the magnitude of the output RF signal as the control input changes;
      detecting a peak in the output RF signal; and
      storing the coarse variable capacitor control input value associated with the output RF signal peak;
   in a fine phase of a tuning mode,
      applying the stored coarse variable capacitor control input value to the variable capacitor;
      incrementing/decrementing a control input to the fine variable capacitor to vary its capacitance between a minimum and maximum value;
      monitoring the magnitude of the output RF signal as the control input changes;
      detecting a peak in the output RF signal; and
      storing the fine variable capacitor control input value associated with the output RF signal peak; and
   in an operating mode,
      applying the stored coarse and fine variable capacitor control input values to the respective coarse and fine capacitances of the variable capacitor.

2. The method of claim 1 wherein incrementing the control input comprises advancing a digital counter.

3. The method of claim 1 wherein storing the respective coarse or fine variable capacitor control input value associated with an output RF signal peak comprises storing the respective prior variable capacitor control input value, to account for delay in detecting a peak in the output RF signal.

4. The method of claim 1 wherein detecting a peak in the output RF signal comprises detecting a change in the algebraic sign of the slope of the output RF signal magnitude as a function of the respective coarse or fine variable capacitor control input value.

5. The method of claim 4 wherein detecting a change in the algebraic sign of the slope of the output RF signal magnitude as a function of the respective variable capacitor control input value comprises
   applying a first respective variable capacitor control input value;
   sampling and holding the output RF signal magnitude with the first respective variable capacitor control input value applied;
   applying a second respective variable capacitor control input value;
   sampling and holding the output RF signal magnitude with the second respective variable capacitor control input value applied;
   comparing the sampled output RF signal magnitudes in a comparator; and
   detecting a change in the polarity of the comparator output.

6. The method of claim 5 further comprising applying positive feedback to the comparator to provide hysteresis to the inputs.

7. A radio frequency (RF) circuit, comprising:
   an input port operative to receive an input RF signal;
   an LC tank circuit comprising an inductor and a variable capacitor having independently variable coarse and fine capacitances wherein the coarse capacitance is greater than the fine capacitance and receiving respective coarse and fine control inputs, and operative to output an RF signal responsive to the input RF signal; and
   a tuning circuit comprising
      a peak detector operative to detect a peak in the magnitude of the output RF signal;
      a controller operative, in respective coarse and fine tuning modes, to receive a peak detection indication and operative to output the respective coarse and fine control inputs to the variable capacitor; and
      a memory element operative to store the coarse and fine variable capacitor control inputs.

8. The circuit of claim 7 wherein the memory element comprises a first memory element operative to store the coarse capacitor control input and a second memory element operative to store the fine capacitor control input.

9. The circuit of claim 7 wherein the variable capacitor includes a varactor, and further comprising a digital to analog converter interposed between the memory element and the varactor.

10. The circuit of claim 7 wherein the controller, in each of coarse and fine tuning modes, is operative to:
- vary the value of a respective coarse or fine variable capacitor control input;
- receive an indication of a peak in the magnitude of the output RF signal; and
- output the value of the respective variable capacitor control input associated with the output RF signal peak.

11. The circuit of claim 10 wherein the memory elements are operative to store, and to output to the variable capacitor in an operating mode, the respective coarse and fine values of the variable capacitor control inputs associated with the respective output RF signal peaks.

12. The circuit of claim 10 wherein the controller, in the tuning mode, is further operative to output the prior value of each of the respective coarse and fine variable capacitor control inputs upon receiving the peak indication, to account for delay in detecting each peak.

13. The circuit of claim 10 wherein the peak detector comprises:
- an RF detector operative to detect the magnitude of the output RE signal;
- a first sample-and-hold circuit connected to the RF detector and operative to store a first value of the magnitude of the output RF signal;
- a second sample-and-hold circuit connected to the RF detector and operative to store a second value of the magnitude of the output RF signal;
- a comparator operative to compare the first value of the magnitude of the output RF signal associated with a first value of the respective coarse or fine variable capacitor control input, with the second value of the magnitude of the output RF signal associated with a second value of the respective coarse or fine variable capacitor control input, and further operative to output an indication which RF signal value is greater.

14. The circuit of claim 10 wherein the peak detector comprises:
- a first combined RF detector and sample-and-hold circuit operative to detect and store a first value of the magnitude of the output RF signal;
- a second combined RF detector and sample-and-hold circuit operative to detect and store a second value of the magnitude of the output RF signal; and
- a comparator operative to compare the stored RF signal magnitude values and to output an indication which RF signal value is greater.

15. The circuit of claim 14, wherein the combined RF detector and sample-and-hold circuit comprises:
- a rectifier comprising two transistors;
- two transmission gates connect to inputs of the rectifier;
- a capacitor connect to an output of the rectifier and operative as sampling capacitor; and
- a bias circuit operative to set bias voltage to the rectifier to zero during a hold period and to a normal bias during a sampling period.

16. The circuit of claim 7 wherein the controller comprises:
- a counter;
- first and a second memory elements operative to store different output values of the counter;
- a third memory element operative to store an indication of detection of a peak in the magnitude of the output RF signal; and
- a multiplexer operative to output a value of the counter during a tuning mode and a calculated value during an operating mode.

17. The circuit of claim 16 wherein:
- the counter is operative to successively output increasing/decreasing values for the respective coarse or fine control input of the variable capacitor;
- the first memory element is operative to store the output of the counter upon receiving from the peak detector the indication of detection of a peak in the magnitude of the output RF signal;
- the second memory element is operative to store the output of the counter upon receiving the delayed indication of detection of a peak in the magnitude of the output RF signal; and
- a linear operating processor operative to receive the two values of counter outputs from the first and second memory elements, and further operative to calculate the calculated value corresponding to the counter output value prior to receipt of the peak detection indication.

18. The circuit of claim 17 wherein the linear operating processor implements the equation $$V_{no} = (k+1)V_{n+1} - kV_{n+2}$$

where $V_{no}$ is the counter output value prior to receipt of the peak detection indication;
$V_{n+1}$ is the output of the first memory element;
$V_{n+2}$ is the output of the second memory element; and
k is a positive number, corresponding to the number of delays from the time where the output RF signal reaches its peak.

19. The circuit of claim 7, further comprising a plurality of cascaded stages, each stage comprising:
- an LC tank circuit comprising a variable capacitor having independently variable coarse and fine capacitances and receiving respective coarse and fine control inputs and an inductor; and
- a memory element operative to store a variable capacitor control input.

20. The circuit of claim 19, wherein each stage further comprises a peak detector.

21. The circuit of claim 20, wherein each stage further comprises a controller.

* * * * *

UNITED STATES PATENT AND TRADEMARK OFFICE
CERTIFICATE OF CORRECTION

PATENT NO. : 8,130,053 B2  
APPLICATION NO. : 12/417446  
DATED : March 6, 2012  
INVENTOR(S) : Mu Page 1 of 1

It is certified that error appears in the above-identified patent and that said Letters Patent is hereby corrected as shown below:

In Column 6, Line 58, delete "$V_{EN2}2$," and insert -- $V_{EN2}$, --, therefor.

In Column 7, Line 29, delete "Vno" and insert -- $V_{no}$ --, therefor.

In Column 8, Line 29, delete "CfCtrl." and insert -- $C_f$Ctrl. --, therefor.

In Column 8, Line 35, delete "$C_c$CTRL" and insert -- $C_c$Ctrl --, therefor.

In Column 8, Line 35, delete "$C_c$CTRL$_{max}$." and insert -- $C_c$Ctrl$_{max}$. --, therefor.

In Column 8, Line 40, delete "$C_c$CTRL" and insert -- $C_c$Ctrl --, therefor.

In Column 8, Line 45, delete "$C_f$CTRL" and insert -- $C_f$Ctrl --, therefor.

In Column 8, Line 45, delete "$C_f$CTRL$_{max}$." and insert -- $C_f$Ctrl $_{max}$. --, therefor.

In Column 8, Line 47, delete "$C_f$CTRL" and insert -- $C_f$Ctrl --, therefor.

In Column 10, Line 26, in Claim 5, delete "comprises" and insert -- comprises: --, therefor.

In Column 10, Line 56, in Claim 7, delete "output the" and insert -- output --, therefor.

In Column 11, Line 23, in Claim 13, delete "RE" and insert -- RF --, therefor.

In Column 12, Line 33, in Claim 18, delete "Vno" and insert -- $V_{no}$ --, therefor.

Signed and Sealed this  
Twelfth Day of March, 2013

Teresa Stanek Rea  
*Acting Director of the United States Patent and Trademark Office*